(12) United States Patent
Camenforte et al.

(10) Patent No.: US 6,544,812 B1
(45) Date of Patent: Apr. 8, 2003

(54) SINGLE UNIT AUTOMATED ASSEMBLY OF FLEX ENHANCED BALL GRID ARRAY PACKAGES

(75) Inventors: Raymundo M. Camenforte, Singapore (SG); John Briar, Singapore (SG)

(73) Assignee: St Assembly Test Service Ltd., Singapore (SG)

( * ) Notice: Subject to any disclaimer, the term of this patent is extended or adjusted under 35 U.S.C. 154(b) by 65 days.

(21) Appl. No.: 09/706,220

(22) Filed: Nov. 6, 2000

(51) Int. Cl.[7] .............................................. H01L 21/44
(52) U.S. Cl. ....................... 438/106; 438/118; 438/121
(58) Field of Search ............................. 438/121, 118, 438/106, 124

(56) References Cited

U.S. PATENT DOCUMENTS

| | | | |
|---|---|---|---|
| 5,397,921 A | 3/1995 | Karnezos | 257/779 |
| 5,409,865 A | 4/1995 | Karnezos | 437/210 |
| 5,620,928 A | 4/1997 | Lee et al. | 438/118 |
| 5,635,671 A | 6/1997 | Freyman et al. | 174/52.2 |
| 5,843,808 A | 12/1998 | Karnezos | 438/121 |
| 5,852,870 A | 12/1998 | Freyman et al. | 29/841 |
| 6,013,946 A * | 1/2000 | Lee et al. | 257/684 |
| 6,111,315 A * | 8/2000 | Sterns et al. | 257/706 |
| 6,326,244 B1 * | 12/2001 | Brooks et al. | 438/124 |

\* cited by examiner

*Primary Examiner*—Michael S. Lebentritt
*Assistant Examiner*—Brad Smith
(74) *Attorney, Agent, or Firm*—George O. Saile; Stephen B. Ackerman

(57) ABSTRACT

A package is provided for the mounting of IC devices. The IC die is bonded to metal traces contained in a flexible tape, the IC die with the flexible tape is attached to a stiffener (heat spreader), the various heat conducting interfaces are cured and solder balls are attached to another surface of the flexible tape.

12 Claims, 6 Drawing Sheets

SINGLE UNIT AUTOMATED ASSEMBLY OF FLEX ENHANCED BALL GRID ARRAY PACKAGES

BACKGROUND OF THE INVENTION (1) Field of the Invention

The invention relates to the fabrication of integrated circuit devices, and more particularly, to a method to automatically assemble flex Ball Grid Array (BGA) packages that have been enhanced.

(2) Description of the Prior Art

In the semiconductor manufacturing industry, device performance continues to improve concurrent with the unrelenting strain of competitive advantage gained by tight control of device manufacturing cost. The basic laws of electronic design and device performance derived therefrom dictate that device performance in most cases can only be gained if device features are further reduced. This has led to the era of the Ultra Large Scale Integration (ULSI) where device features in the micron and sub-micron range are becoming the norm. This results in greatly increased device density which in turn results in increased requirements that are imposed on the technology that concerns itself with the connection of the completed devices to the surrounding electronic interfaces or components.

Increased device circuit density does not necessarily result in smaller device packages. In fact, in many applications, device package size has increased concurrently with the increase in device density. The requirements to connect higher density, larger size devices to the surrounding environment has led to the development of surface mounted packages. With the increase in device density and the concomitant increase in functions being packaged per Integrated Circuit (IC), the need has arisen to provide increased input/output (I/O) capabilities for the IC. This increase in I/O connectivity however must be provided while reducing the footprint of the interconnecting medium, while maintaining acceptable thermal performance of the package and at the same time having no negative impact on the package reliability.

One of the conventional methods that have been used to assemble IC's with high device density and high I/O requirements has been the use of Tape Automated Bonding (TAB) or lead-frame packages. A TAB or lead-frame typically contains only one layer of interconnect lines. As is well known in the art, these packages can thermally and electrically perform satisfactorily with an I/O count of up to 300 leads at a thermal rating of 10 Watts while operating at a clock rate of 50 MHz. The area that is taken up be the I/O connects is determined not only by the footprint of the interconnect points but also by the distance or pitch between these I/O interconnect points. The presently established pitch is around 0.5 mm between adjacent I/O points; this does however impose limitations on the IC device interconnectivity. It is also clear that device operating speed will continue to increase at the same time that power (watts) consumed per IC device will continue to increase concurrent with the increase in circuit density. Decreasing the pitch of the I/O interconnect lines requires ever increasing sophistication in the deposition of the interconnect lines, a requirement that is further emphasized by requirements of adhesion to the underlying surface, contact resistance, resistance to corrosion and, ultimately, requirements of reliability in the face of high temperature down-stream processing.

The development of the Ball Grid Array (BGA) devices has offered the opportunity to spread device I/O interconnect points over the entire surface of the device, this as opposed to having I/O connect points available only around the periphery of the IC device. Typically, the BGA package is surface mounted and mounted on the surface of a motherboard (a Printed Circuit Board or PCB). The concerns of making reliable I/O interconnects now have shifted from fine pitch in-line lines to contact balls. General sizes that are currently in use for Quad Flat Pack (QFP) packages are a footprint in the 25×25 mm range, a lead pitch of around 0.5 mm while the package itself is about 2 mm thick. A typical ball pitch for a BGA package is around 1.5 mm, with a footprint similar in size to the QFP package and a package thickness similar or slightly less than the thickness of a QFP package.

In assembling a BGA package to a PCB, the lower surface of the PCB is typically provided with contact balls that connect to an interfacing network of conducting lines that connect to surrounding electrical components or systems. A typical PCB contains two layers of interconnect metal. A cavity is typically formed in the upper surface of the PCB, the semiconductor device that is to be mounted on the PCB is inserted into this cavity. The contact balls of the BGA make electrical contact with the layers of interconnect metal in the PCB, the BGA die is further wire bonded to the PCB and enclosed in a molded casing. The operation of wire bonding limits the size of the surface on which the wire is connected which in turn increases the size of the die that can be used. The side of the BGA that faces the PCB in this arrangement is the backside of the IC die, heat exchange between the BGA die and the underlying PCB takes place through this interface of the BGA die with the PCB. Since signal lines (in the PCB) are typically of fine construction, these lines do not lend themselves to provide a good path for heat exchange. The heat exchange between the BGA and the PCB must therefore depend on (wider or larger in cross section) ground planes in the PCB, which brings with it a limitation on the-space that is available to route signal lines in the PCB.

Present PCB technology is limited in the reduction of line size that it can apply in a cost effective and reliable design. This limits the operating clock cycle for the circuit application in which the PCB can be used.

In mounting relatively small size IC devices on the surface of relatively large size PCB's, the thermal expansion and the related acceptance or rejection or moisture content within the larger PCB can have a serious negative effect on the package performance under elevated temperatures. In the case where there is a high moisture content present in the assembled PCB, this moisture content will expand rapidly during down-stream operations, especially where these down-stream operations are required for the assembly of the BGA packages to the PCB. This rapid expansion of the PCB can cause severe thermal stress in interconnected surfaces to the point where these surfaces may be dislocated and break. It is therefore of great importance that every effort is made to limit the moisture content in the PCB prior to the assembling of the BGA into the PCB.

Thermal performance of a PCB mounted BGA can be improved by enhancing the contact between the PCB and the BGA by adding a body of metal in the cavity that is created in the PCB for the insertion of the BGA. This method has been applied successfully when mounting the BGA in a cavity that is created in the lower surface of the PCB. This method of mounting the BGA is however more difficult and incurs added cost in the manufacturing process.

Many of the techniques that have been discussed for mounting IC devices that have extended I/O capabilities do not lend themselves to high speed, automated methods of assembly. The well-known technique of Tape Ball Grid Array (TBGA) suffers from this disadvantage resulting in high assembly cost for the package. An exception from this is the Plastic Ball Grid Array (PBGA) where multiple PBGA's can be formed from a single PCB strip while standard processing equipment has been designed to perform the process of assembling the package. The PCB strip that is used to assemble the PBGA package constitutes a substrate for providing interconnects in the package while serving as structural support for the package. The cost of assembling the PBGA package is sharply increased by the fact that, during assembly of the package, a relatively large amount of the PCB is discarded during the assembly.

A further consideration in using mounting methods for mounting BGA devices is the reflow and melting temperature of the contact balls. For BGA devices that are mounted on for instance PCB strips, some of the materials that make up the PCB strip may be affected by increased temperatures in an unacceptable process. If therefore the temperature of the PCB mounted BGA device is raised, for instance for rework purposes, damage to the PCB material may result. The chemical composition of the material used for the contact balls also plays a role in this in that the flow or softening of the contact balls is determined by the materials that have the lowest flow or melting point thereby making the contact balls unsuitable for high temperature environments. It can in this manner occur that, when a PBGA is removed from the motherboard for rework, some of the contact balls will separate from the PBGA package and adhere to the PCB. This results in time consuming and expensive rework or in complete loss of the removed device or even the PCB from which the device was removed.

Solder ball fatigue and mechanical stress that is exerted on the solder ball where the balls make contact determine the reliability performance of the ball interconnects. Ball fatigue is strongly influenced and determined by the thermal environment in which the contact balls are used with frequent and extreme variations in the temperature of the surrounding environment having a serious negative effect on the long term reliability of the contact balls. This effect can further be aggravated and can result in mechanical failure (sheer or breakage) if the thermal expansion of the environment with which the contact balls interface reacts have thermal coefficients of expansion that differ significantly from the thermal expansion of the contact balls. Under these conditions of thermal reaction, the mechanical stress that is exerted on the contact balls due to the thermally induced and mutually contradictory way of expansion and contraction, the contact balls have a high probability of mechanical failure making the overall package unreliable. It is therefore of key importance to realize that thermal performance is part of the overall package design and that considerations of cooling and transmission of heat generated by the devices that are mounted in these packages are very important in creating a successful package design.

U.S. Pat. No. 5,843,808 (Karnezos) shows an assembly of a Tab grid array assembly in strip form. Cited by the inventors.

U.S. Pat. No. 5,409,865 (Karnezos) and U.S. Pat. No. 5,397,921 (Karnezos) show TAB grid arrays.

U.S. Pat. No. 5,852,870 (Freyman et al.) shows a method for a Grid array assembly.

U.S. Pat. No. 5,635,671 (Freyman et al.) shows a mold runner removal process for a package.

U.S. Pat. No. 5,620,928 (Lee et al.) teaches a BGA method using a flex tape.

SUMMARY OF THE INVENTION

A principle objective of the invention is to provide a reliable and cost effective package for packaging BGA devices. The package comprises a tape with adhesive and copper traces attached below, a solder mask layer with openings that covers the copper traces, a stiffener structure having a cavity for accommodating the die having an electrically conductive surface In accordance with the objectives of the invention a new package is provided for the mounting of IC devices. The IC die is bonded to metal traces contained in a flexible tape, the IC die with the flexible tape is attached to a stiffener (heat spreader), the various heat conducting interfaces are cured and solder balls are attached to another surface of the flexible tape. The invention offers the means for single unit (or package) attachment and transportation, a process carrier is used for this purpose. The process carrier is a flexible band or tape on which a single package is mounted and transported between processing stations. A carrier holder interfaces between the single unit and the process carrier.

DESCRIPTION OF THE PREFERRED EMBODIMENTS

Figure 1:
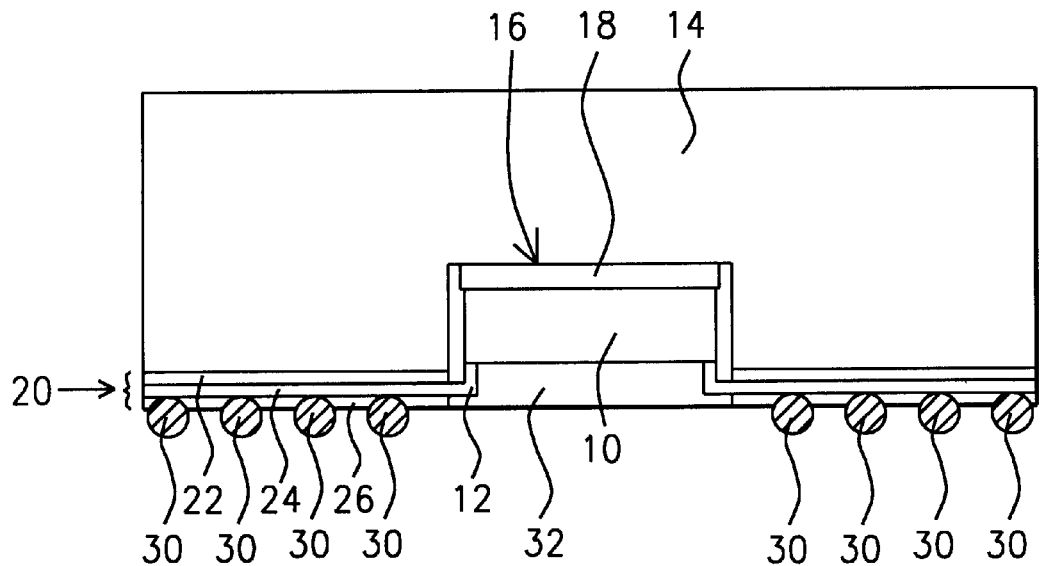
FIG. 1 shows a cross section of the Tape Automated Bonding (TAB) package using inner lead bonding techniques.

Referring now specifically to FIG. 1, there is shown a cross sectional view of a Tape Automated Bonding (TAB) package of the present invention. The semiconductor chip or die 10 takes up the center of the package; the contact points 12 of the die 10 are closely spaced around the periphery of the die 10.

The heat spreader 14 takes in the main body of the TAB package, cavity 16 is provided in the heat spreader 14 for the mounting of the Integrated Circuit (IC) chip 10. The top of the IC chip 10 is in close physical contact with the heat spreader 14 via a thin adhesive layer 18 of thermally conductive epoxy. The contact points 12 of the die 10 are conductively bonded, using inner lead bonding techniques, to tape 20.

Tape 20 contains three layers 22 (the top layer), 24 (the center layer) and 26 (the bottom layer). Layer 22 is a layer of tape adhesive that connects that tape to the bottom surface of the heat spreader 14. The center 24 of the tape contains copper interconnect lines while the bottom layer 26 of the tape is the solder mask layer for interconnect to the contact points (typically contact balls) that are connected to the overall package. The top layer 22 of tape 20 attaches the flexible tap 20 to the bottom surface of the heat spreader 14, the heat spreader 14 in this manner also serves as a stiffener for the tape 20.

Heat spreader (or stiffener) 14 has, as already indicated, a cavity 16 for insertion of the semiconductor die 10, the surface of the heat spreader 14 is electrically conductive. The interface between the TGA package and the surrounding circuitry of which the TGA package is a functional part and is provided by a plurality of solder balls 30, each solder ball has the approximate size of the size of the openings in the solder mask layer 26, the solder balls are in this manner connected to electrically conducting paths of the copper traces contained in the copper interconnect layer 24.

The contact balls 30 connect to the outside circuitry by connecting to conductive pads, these conductive pads are not part of the TGA package but form the direct interface between the contact balls 30 of the TGA package and the interconnect lines of the outside circuitry.

These latter interconnect lines are typically part of an external (external to the TGA package) Printed Circuit Board (PCB). The interconnect points 12 of the IC die 10 are, as already noted, connected to free standing ends of the copper traces 24 using TAB inner lead bonding techniques. The interconnect points 12 of the IC die 10 can also be connected to free standing ends of the copper traces 24 using TAB wire bonding techniques, this is highlighted under FIGS. 7 through 13 following.

The encapsulation material 32 fills the cavity 16 of the heat spreader 14 with the exception of the top surface of the IC die where the IC interfaces with the heat spreader 14 via layer 18. The encapsulation material encloses the IC die 10 and penetrates between the IC die 10 to TAB inner bond or wire bonding connections 12.

A special use can be made of solder ball 31, this solder ball provides a direct connection between the underlying Printed circuit Board (PCB) and the stiffener 14 thereby establishing a direct ground connection between the PCB and the stiffener 14. It is clear that, where required, more than one (ground) connection between the PCB and stiffener of the TAB device package can be established in this manner.

Figure 2:
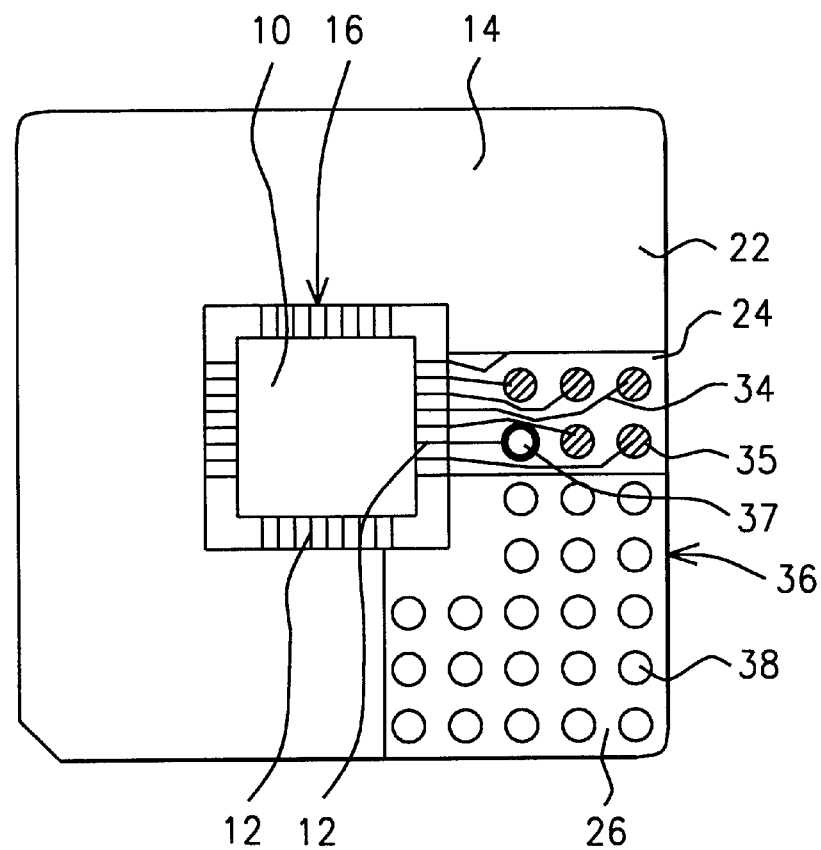
FIG. 2 shows a top view of the IC die with a partial cutout of the tape that is used in assembling the TAB package using inner lead bonding techniques.

Further detail relating to the TAB tape 20 is shown in the partial cutout view of tape 20 in FIG. 2. FIG. 2 shows a top view of the IC die 10, with die pads 12, in addition to the partial cutout of tape 20. Tape 20 contains a layer of copper traces (or interconnect lines) 24, one layer 22 of adhesive on one side (of layer 24) and one layer 26 of solder mask to which the contact balls 30 are connected. Copper traces (interconnect lines) 34 form a network of conducting lines (in layer 24 of tape 20) that spread out from the periphery of the opening 16 that has been created in the heat spreader 14. Each of the copper traces 34 end in a pad area 35, this pad area 35 aligns with the solder mask layer 26 for connection of the copper traces 34 to the surrounding circuitry.

Pad designs may differ based on the functional requirements that are imposed on the pad. The majority of interconnects to an IC die carry signal lines, for those interconnects the pads (for instance pad 37) can be of open design thereby improving circuit performance. For pads that are required to carry relatively large currents (for instance pad 35) and for which power dissipation becomes a concern, the pads may be of solid construction. For the copper traces 24, the distance between adjacent lines may be between 500 and 1000 microns while the pad diameter may be between about 200 and 700 microns.

Where, in FIG. 2, the cutout 24 highlighted the copper traces within tape 20, cutout 36 highlights the solder mask layer 26 of tape 20. Contact points 38 are provided in this solder mask for contact to the underlying contact balls 30.

The following details of materials used and design considerations apply to the TGA package of the invention:

the stiffener or heat spreader contains a thermally conductive material the stiffener material has a thermal coefficient of expansion that is approximately equal to that of silicon the stiffener material is made of copper the stiffener has a conductive surface that is plated with metal that is wettable by solder, this metal is selected from a group that consists of silver and gold the thickness of adhesive layer of the TAB tape is selected to allow the electrically conductive traces and the stiffener to form an electric path of controlled impedance the apertures that are provided in the TAB tape for insertion of the IC die are slightly larger than the opening of the cavity that is provided in the stiffener for the insertion of the IC die, in this manner a bond wire can make ground connection between the IC die and the stiffener.

The process of assembling a TAB grid array package will be discussed next. First the process of assembling using the inner lead bonded techniques will be highlighted, the process of assembling using wire-bonded techniques will be discussed after that.

Figure 3:
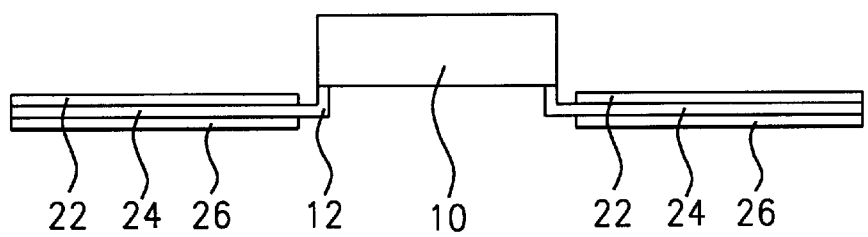
FIG. 3 shows an IC die bonded to a flex tape using inner lead bonding techniques.

In FIG. 3, the contact pads on die 10 are bonded to the free standing copper tape traces of tape 20, that is traces 12 that are part of layer 24 of tape 20 (FIG. 2), this using inner lead bonding techniques. Layer 22 as indicated in FIG. 3 is the tape adhesive, layer 24 is the layer of copper traces while layer 26 is the solder mask layer with openings to connect the solder balls 30 (FIG. 1).

Figure 4:
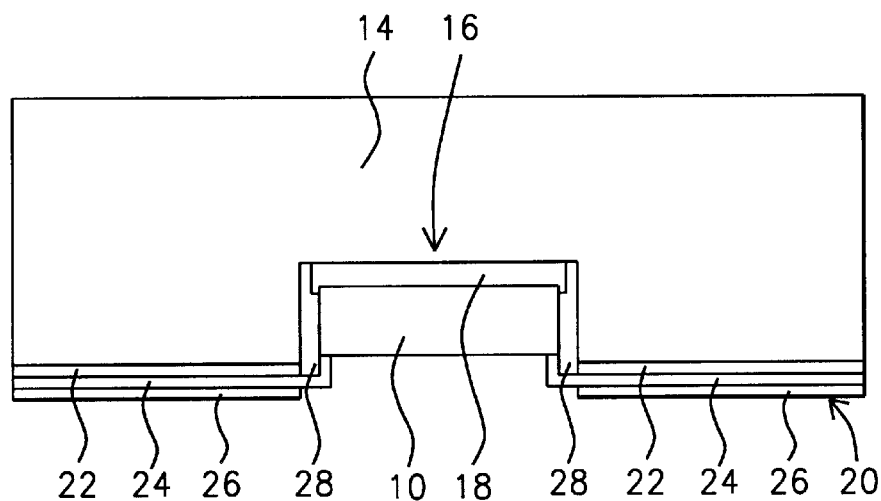
FIG. 4 shows the inner lead bonded IC die with the flex tape connected to the stiffener of the BGA package.

FIG. 4 shows a cross section of the heat spreader 14 with the die 10 inserted into cavity 16. The flexible tape 20 is attached to the heat spreader 14 by means of the adhesive layer 22 of the tape. The die 10 is attached to the heat spreader 14 via the back wall of cavity 16; the thermally conductive layer 18 attaches the die 10 to the heat spreader 14. The thermally conductive adhesive layer 18 is cured. At this point in the process there as yet exists an opening 28 between the sidewalls of the die 10 and the heat spreader 14.

Figure 5:
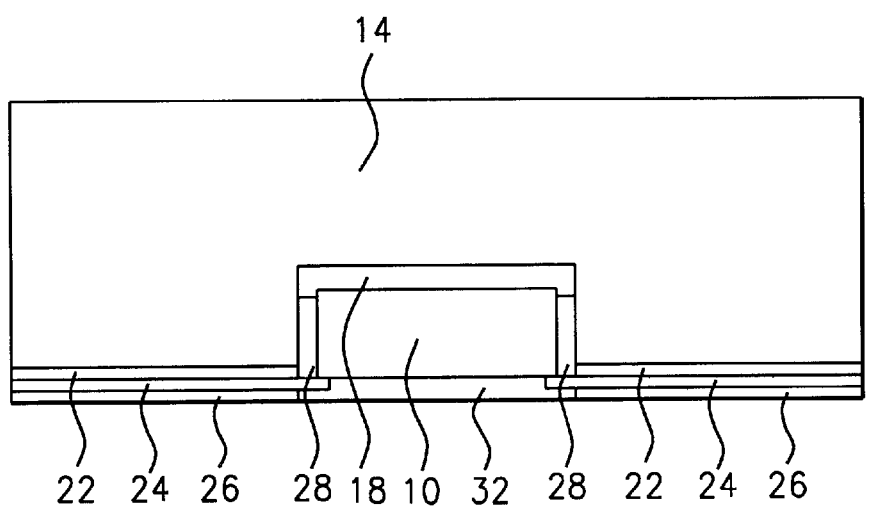
FIG. 5 shows the encapsulation of the inner lead bonded IC die inside the cavity of the package stiffener.

FIG. 5 shows how the opening 28 (FIG. 4) between the die 10 and the heat spreader 14 is filled by insertion of a molding compound material 32 into this opening by a transfer molding process and fills not only opening 28 (FIG. 4) but is also inserted between the inner lead bonded connections of die 10. The ink marking of the unit is applied. The final molding compound or material is post mold cured and an ink mark is used at the same time.

The significant advantages of the transfer molding process over the prior art syringe encapsulation process are:

the transfer molding process has faster throughput, and the consistency of the molded package height for transfer molding is much more consistent.

Figure 6:
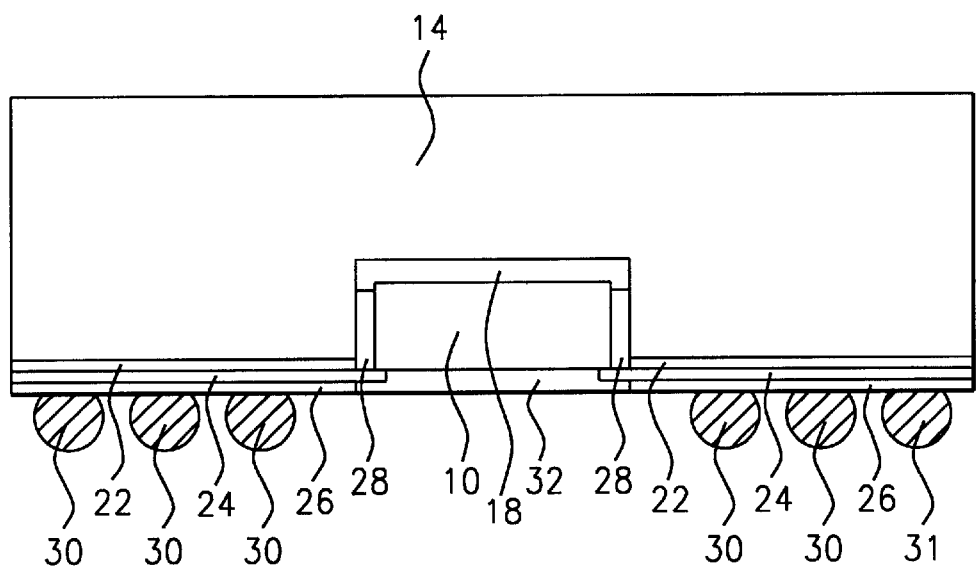
FIG. 6 shows the inner lead bonded BGA package after the solder balls have been connected.

The next step required for the assembly of the wire bonded TAB grid array package is to connect the solder balls 30 to the package, FIG. 6 addresses this step. Solder flux is applied to the balls that need to be attached to the package, the solder balls are then attached to the solder mask 24 (conductive pads) of the tape 20. The solder balls 30 are re-flowed by applying heat to the package; excess flux is cleaned from the conductive pads by applying an appropriate cleaning agent. As a final step, the IC package is dry baked, which completes the process of assembling the inner lead bonded package.

It can be appreciated that the process of encapsulating TAB grid array packages, a process that has so far been addressed for a single package containing a single IC die, can readily be expanded to include multiple packages in an automated process. This process starts by placing a number of stiffeners on the surface of a carrier strip with each of the stiffeners having an opening. A multiplicity of pieces of tape, each piece to be used for one stiffener, is made available. These singulated tape frames are typically provided in reel or panel form from which they can be readily removed for application to individual stiffeners. Each frame contains bonding pads for connecting the IC die that is to be contained within the stiffener, solder ball bonding pads and interconnecting lines (conductive traces) that connect the die bonding pads with the solder ball bonding pads.

Each frame is connected to a stiffener using a tape adhesive that is made of thermoset or thermoplastic epoxy and that can withstand temperatures of above 300 degrees C. The encapsulation of the IC die is completed using the same processing steps as previously indicated of inserting the die to the back of the cavity with die attach epoxy, curing the thermally conductive adhesive in the cavity of the heat spreader, bonding the copper traces on the tape (for wire bonds) and encapsulating the die in the cavity of the stiffener and curing the encapsulating material. The solder balls are then attached to the conductive bond pads of the frames using a re-flow procedure. The solder balls that are used under the invention are made using a composite material consisting of tin, lead, and silver alloy in the ratio of 63:36:2. After the solder balls have been attached, the stiffeners can be separated into individual units by removing the stiffeners from the carrier strip.

Figure 7:
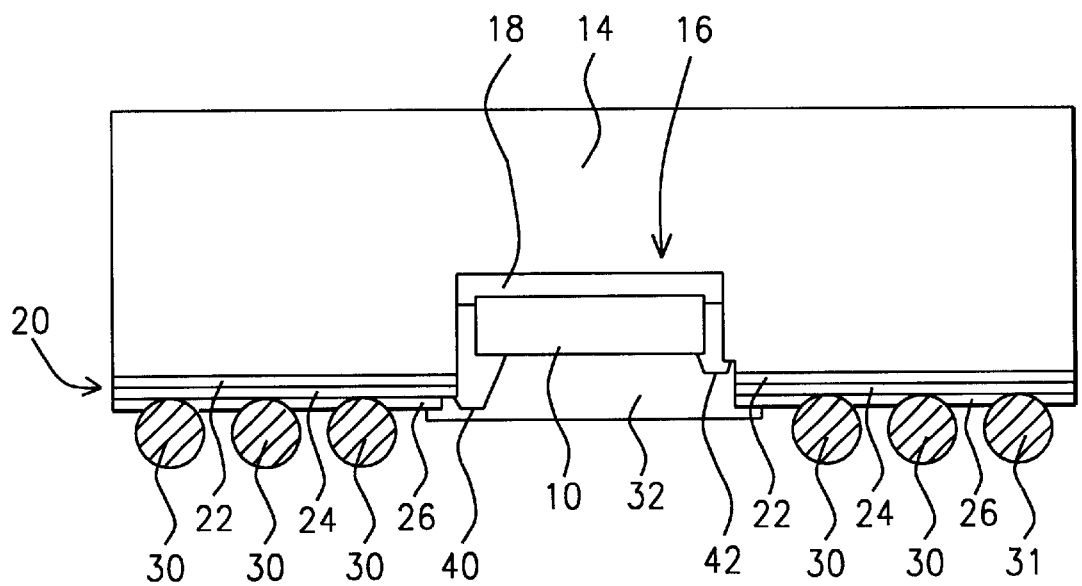
FIG. 7 shows a cross section of the Tape Automated Bonding (TAB) package using wire bonding techniques.
Figure 8:
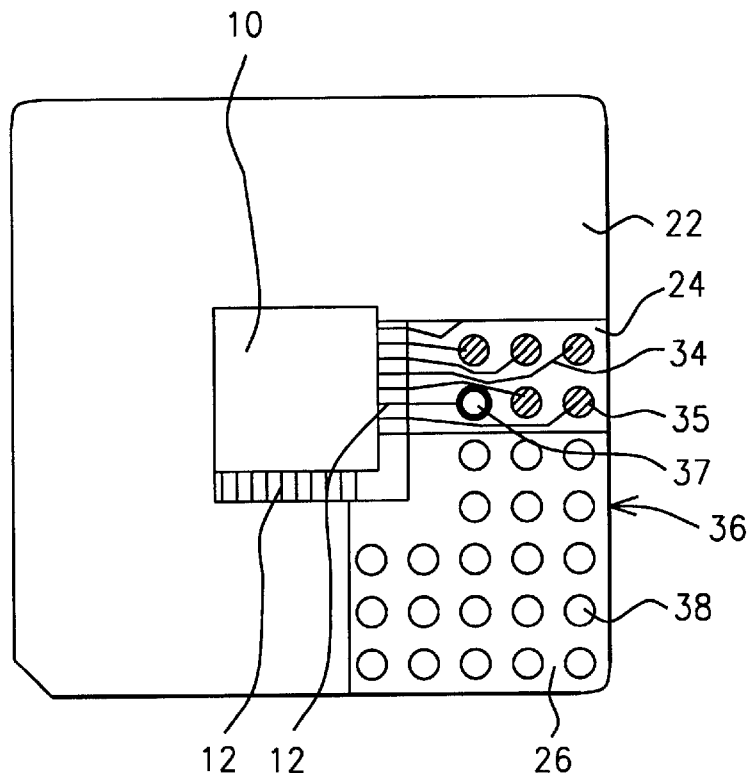
FIG. 8 shows a top view of the IC die with a partial cutout of tape that is used in assembling the TAB package using wire bonding techniques.

A clear distinction must be made between inner lead bonding and wire bonding. The TAB package that is assembled using wire bonding techniques is discussed under the following FIGS. 7 through 13. The copper traces of the center layer 24 of the tape 20 are connected, using typical bonding techniques, to the contact points 12 of the die 10. For wire bonding the package arrangement is slightly different in that the contact points of the IC die are connected to traces of the center layer 24 of the tape 20 using wire-bonding techniques. This is shown in FIG. 7. The bond wires 40 and 42 are shown here as applied for the connection of the IC die to layer 24 of tape 20. It is clear that these wires can only be accommodated if the opening in the tape 20 that overlies the opening of the cavity in the heat spreader is slightly larger than the cavity in the stiffener. Wire 40 indicates a wire bonded connection between a contact point on IC die 10 to the copper traces contained in layer 24 of tape 20. A direct connection 42 can also be made between the IC die 10 and the stiffener 14. This direct connection 42 typically is a ground connection. As is shown in FIG. 8, the interconnect traces of layer 24 are, by virtue of their being attached directly to the stiffener by means of the adhesive layer 22, firmly supported by the surface of the stiffener. This establishes the necessary mechanical support for the wire bonding operation.

The process of assembling the wire bonded TAB package is further explained using FIGS. 9 through 13.

Figure 9:
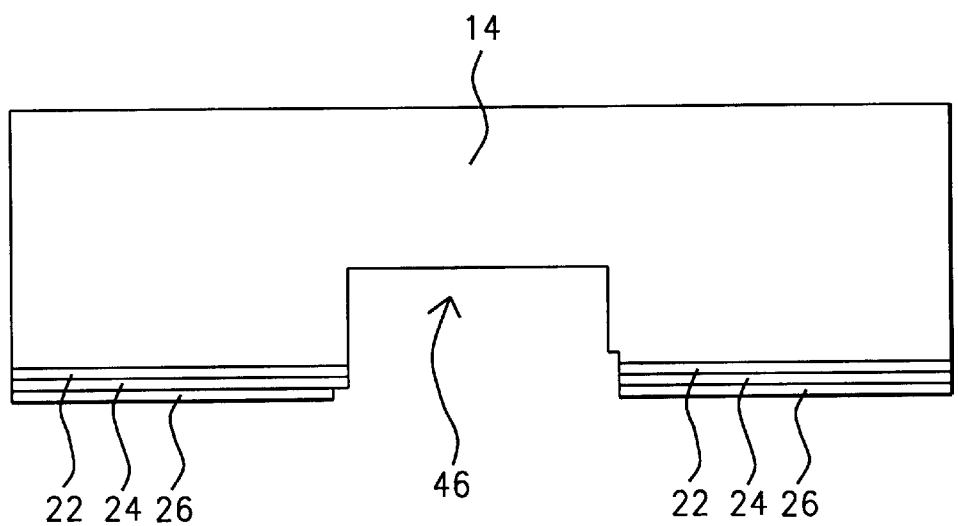
FIG. 9 shows a flex attached to a stiffener in preparation for wire bonding.

FIG. 9 shows how TAB tape 20 is attached to the heat spreader 14 using the adhesive layer 22 of tape 20. Tape 20 contains, as has previously been indicated, the adhesive layer 22, the layer 24 of copper traces for the interconnect network of the tape 20 and the solder mask layer 24. The adhesive layer 22 is cured after the tape 20 has been attached to the heat spreader 14. Cavity 46 is at this time provided in the heat spreader 14.

Figure 10:
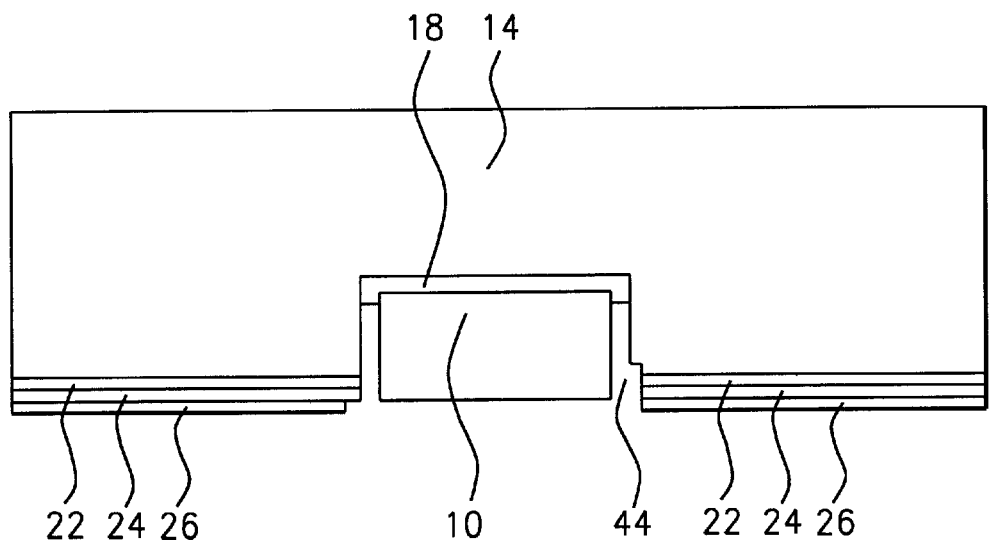
FIG. 10 shows the IC die with the flex tape connected to the stiffener of the BGA package in preparation for wire bonding.

FIG. 10 shows how a layer 18 of thermally conductive epoxy is deposited over the top surface of cavity 46, the IC die 10 is attached to the heat spreader 14 by means of this layer 18. The epoxy layer 18 is cured after the IC die 10 has been inserted into cavity 46. The opening 44 between the sides of IC die 10 and the stiffener 14 is at this time vacant and will be filled during a subsequent processing step.

Figure 11:
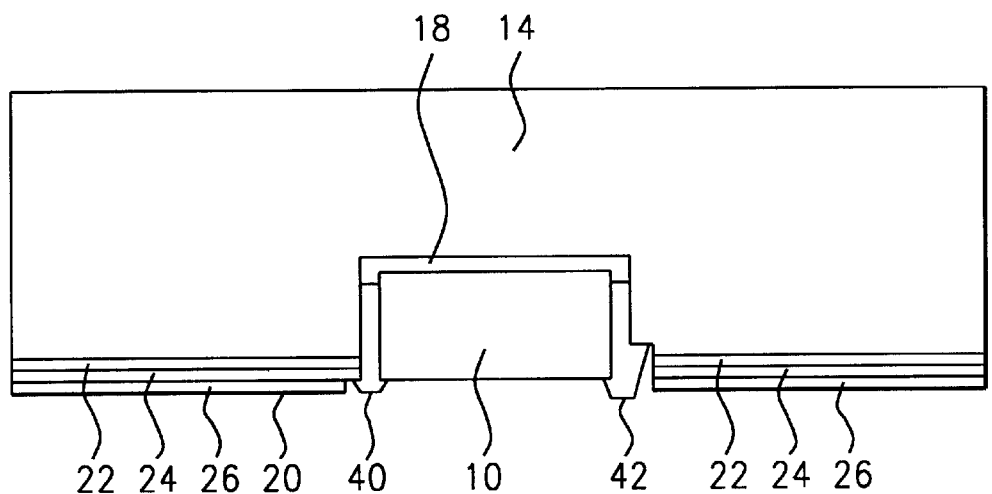
FIG. 11 shows the wire bonding of the IC die inside the package stiffener.

FIG. 11 shows how the contact points on the IC die 10 are connected, by wire bonding, to the copper traces in layer 24 of tape 20. Bond wire 40 is typically a signal connector while bond wire 42, which connect a contact point on the IC die 10 to the stiffener 14, is typically a ground connection.

Figure 12:
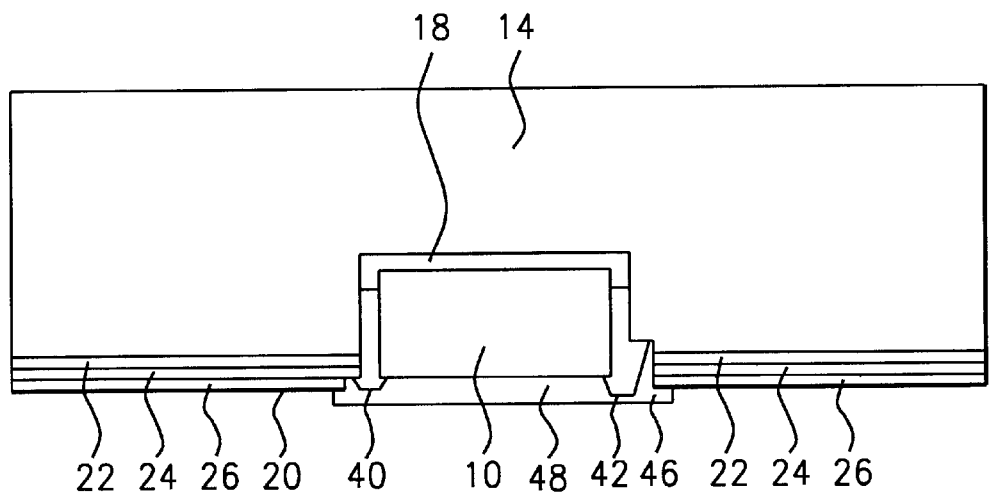
FIG. 12 shows the wire bonded BGA package after encapsulation of the IC die inside that cavity of the stiffener.

FIG. 12 shows how the IC die 10 is encapsulated using a molding compound material applied by transfer molding to surround the die 10 forming the encapsulation layer 48. It must be noted that this layer not only surrounds the IC die 10 but also covers the bond wires. The ink markings of the unit are applied. The final molding compound layer 48 is post mold cured after injection and ink-marked at the same time.

Figure 13:
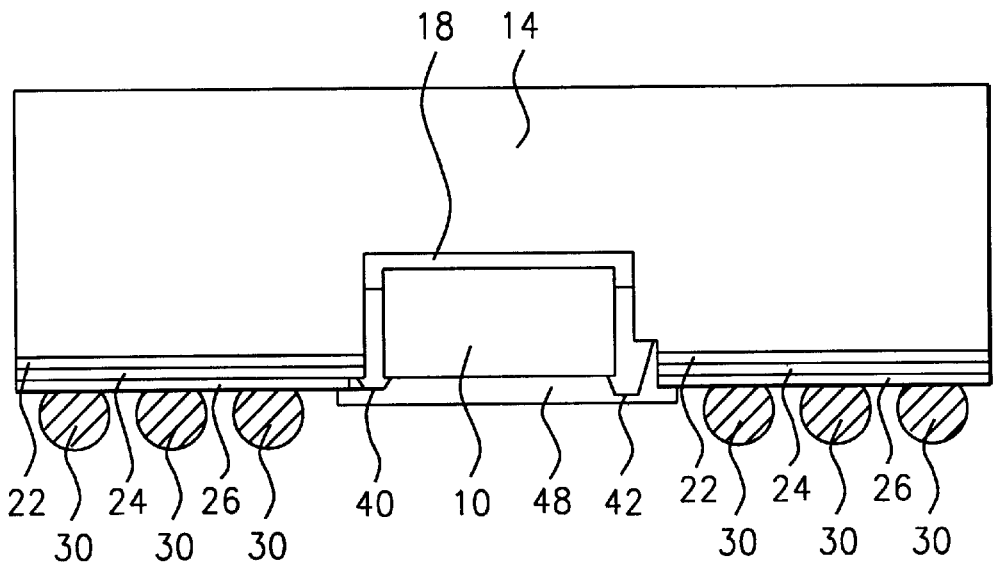
FIG. 13 shows the wire bonded BGA package after the contact balls have been attached to the package.

FIG. 13 shows the attachment of the solder balls 30, this process is identical to the previously highlighted process of attaching the solder balls and does therefore not need any further explanation at this point.

For extremely fine pitch packages, where the distance between the contact points of the IC die is very small, the inner lead bonding packages is better suited. Wire bonding requires better access to the bonding contact points and is therefore not suited to extremely fine pitch connections. Wire bonding is therefore typically used for packages with larger pitch interconnects, these packages tend to be more expensive to produce. The wire used during the wire bonding operation also introduces larger parasitic elements into the circuit configuration resulting in limiting the high-end frequency range over which wire bonded packages can be used.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for assembling of a Tape Automated Bonding (TAB) package, comprising:

providing an Integrated Circuit (IC) die; providing a flexible TAB tape, said flexible TAB tape comprising a first or lower layer, a second or center layer and a third or upper layer, said third or upper layer comprising an adhesive layer;

attaching said die to a back wall of a cavity in a stiffener using a thermally conductive adhesive;

attaching said flexible TAB tape to the stiffener using a tape adhesive;

curing said thermally conductive material;

bonding copper traces of said flexible TAB tape to corresponding bond pads of the die using wire bond techniques;

encapsulating said IC die inside said cavity, enclosing said die and said TAB wire bond connections, using encapsulating material;

curing said encapsulating material;

applying solder flux to one or more solder balls;

applying the one or more solder balls to conductive pads on said flexible TAB tape;

re-flow said solder balls by applying heat;

cleaning excess solder flux from the conductive pads using an appropriate cleaning agent; and dry baking the TAB package.

2. The method of claim 1, said lower layer comprising:

a first opening for insertion of said IC die;

a solder mask layer comprising interconnect points between said flexible TAB tape and said one or more solder balls;

an first array of conductive pads, a pitch between said conductive pads being between about 1 and 2 mm, a diameter of said conductive pad being between about 0.5 and 1.0 mm; and a conductive pad in said first array of conductive pads having an opening aligning with a matching opening in said center and said upper layer.

3. The method of claim 1, said center layer comprising:

a second opening for insertion of said IC die, said second opening aligning with a first opening in said bottom layer;

copper traces with a second array of conductive pads, said copper traces forming metal interconnect lines using TAB inner lead bonding connections between free standing ends protruding into said second opening and an array of conductive pads within said IC die, said second array of conductive pads being aligned with a first array of conductive pads on said lower layer of said TAB tape; and a conductive pad in said second array of conductive pads having an opening aligning with a matching opening in said lower and said upper layer.

4. The method of claim 1, said center layer comprising:

a second opening for insertion of said IC die, said second opening aligning with a first opening in said bottom layer;

copper traces with a second array of conductive pads, said copper traces forming metal interconnect lines using wire bonding connections between said interconnect lines and an array of conductive pads within said IC die, said second array of conductive pads of said copper traces aligning with a first array of conductive pads on said lower layer of said TAB tape; and a conductive pad in said second array of conductive pads having an opening aligning with a matching opening in said lower and said upper layer.

5. The method of claim 1, said upper layer comprising:

a third opening for insertion said IC die, said third opening aligning with a second opening in said center layer;

an adhesive layer, said adhesive layer being an interface between said TAB tape and said stiffener, attaching said TAB tape to said stiffener; and an opening aligning with a matching opening in said lower and said center layer.

6. The method of claim 1, said stiffener being a copper stiffener comprising:

a cavity for insertion of said IC die;

an electrically conductive surface plated with a metal that is wettable by solder this metal being selected from the group consisting of silver or gold; and a material having a thermal expansion coefficient being approximately equal to a thermal expansion coefficient of silicon.

7. A method for assembling a multiplicity of Tape Automated Bonding (TAB) packages, comprising:

providing a multiplicity of IC die;

providing a flexible TAB tape comprising a multiplicity of flexible TAB tapes, said flex tapes comprising a first layer, a second layer and an upper layer, said upper layer comprising an adhesive layer;

providing a carrier strip;

providing a multiplicity of stiffeners having a cavity;

attaching said multiplicity of stiffeners to said carrier strip;

separating said multiplicity of flex tapes into individual sections of flex tapes, a section of flex tape accomodating a stiffener;

transporting said stiffeners to successive work stations using said carrier strip as a means of transportation, each work station being dedicated to and being equipped for performing at least one of assembly dedicated to a sequence of assembling said multiplicity of Tape Automated Bonding (TAB) packages;

providing a stiffener with a section of flex tape;

attaching an IC die to a back wall of a cavity in a stiffener forming part of said multiplicity of stiffeners using a thermally conductive adhesive;

attaching a section of flexible tape to a matching stiffener using tape adhesive;

curing said thermally conductive adhesive;

bonding copper traces on said flexible TAB tape to corresponding bond pads of an IC die using inner bond leads;

encapsulating said IC die inside said cavity, enclosing said die and TAB inner lead bond connections;

curing said encapsulating material;

applying solder flux to at least one solder ball;

applying at least one solder ball to conductive pads on said flexible TAB tape;

re-flow said solder balls by applying heat;

cleaning excess solder flux from conductive pads on said flexible TAB tape using an appropriate cleaning agent;

dry baking the TAB package; and separating said multiplicity of stiffeners into individual stiffeners.

8. The method of claim 7, wherein:

said first layer comprises a solder mask being interconnect points between said flexible TAB and solder balls, further comprising a first array of conductive pads, a pitch between said conductive pads being between about 1 and 2 mm, a diameter of a conductive pad being between about 0.5 and 1.0 mm, furthermore comprises a first opening for insertion of said IC die, furthermore comprises a conductive pad in said first array of conductive pads having an opening aligning with a matching opening in a center and an upper layer of said flexible TAB tape;

said second layer comprises a second opening for insertion of said IC die, said second opening aligning with said first opening in said lower layer, further comprises copper traces with a second array of conductive pads, said copper traces forming metal interconnect lines using wire bonding connections between said copper traces and an array of conductive pads on said IC die, said copper traces emanating from said second opening in said center layer, said second array of conductive pads aligning with said first array of conductive pads on said lower layer of said TAB tape, furthermore comprises a conductive pad in said second array of conductive pads having an opening aligning with a matching opening in a conductive pad of said lower and said upper layer; and said upper layer comprises an adhesive layer, said adhesive layer forming an interface between said TAB tape and said stiffener, attaching said TAB tape to said stiffener, furthermore comprises a third opening for insertion of said IC die, said third opening aligning with said second opening in said center layer, furthermore comprises an opening aligning with a matching opening in said lower and said center layer.

9. The method of claim 7, said multiplicity of stiffeners comprising copper, a stiffener of said multiplicity of stiffeners comprising:

a cavity for insertion of said IC die;

an electrically conductive surface plated with a metal being wettable by solder, the metal being selected from the group consisting of silver or gold; and a material having a thermal coefficient of expansion being about equal to a thermal coefficient of expansion of silicon.

10. A method for assembling a multiplicity of Tape Automated Bonding (TAB) packages, said packages comprising an Integrated Circuit die, comprising the steps of:

providing a multiplicity of IC die;

providing a flexible tape comprising a multiplicity of flex tapes, said flex tapes comprising a first or lower layer, a second or center layer and an upper layer, said upper layer comprising an adhesive layer;

providing a carrier strip;

providing a multiplicity of stiffeners having a cavity;

attaching said multiplicity of stiffeners to said carrier strip;

separating said multiplicity of flex tapes into individual sections of flex tapes, each section of flex tape accomodating one stiffener;

transporting said stiffeners to successive work stations using said carrier strip as a means of transportation, each work station being dedicated to and being equipped for performing at least one step assembling said multiplicity of Tape Automated Bonding (TAB) packages;

providing each stiffener with a matching section of flex tape;

attaching an IC die to a back wall of said cavity in a stiffener using a thermally conductive adhesive;

attaching a section of flexible tape to its matching stiffener using tape adhesive;

curing said thermally conductive adhesive;

bonding copper traces on said flex tape to corresponding bond pads of the IC die using wire bonding techniques;

encapsulating said IC die inside said cavity of said stiffener, enclosing said die and said TAB inner lead bond connections;

curing said encapsulating material;

applying solder flux to at least one solder ball;

attaching at least one solder ball to conductive pads on said flex tape;

re-flow said solder balls by applying heat;

cleaning excess solder flux from conductive pads of said flex tape using an appropriate cleaning agent;

dry baking the TAB package; and separating said multiplicity of stiffeners into individual stiffeners.

11. The method of claim 10, wherein:

said first or lower layer is a solder mask of interconnect points between said TAB tape and said plurality of solder balls, furthermore comprises a first array of conductive pads, a pitch between said conductive pads being between about 1 and 2 mm, a diameter of said conductive pad being between about 0.5 and 1.0 mm, furthermore comprises a first opening for insertion of said IC die, furthermore comprises a conductive pad in said first array of conductive pads having an opening aligning with a matching opening in a center and an upper layer of said flexible tape;

said second or center layer comprises a second opening for insertion of an IC die, said second opening aligning with said first opening in said lower layer, furthermore comprises copper traces with a second array of conductive pads, said copper traces forming metal interconnect lines using wire bonding connections between free standing ends protruding into said second opening, said copper traces emanating from said second opening in said center layer, said second array of conductive pads aligning with said first array of conductive pads on said lower layer of said TAB tape, furthermore comprises a conductive pad in said second array of conductive pads having an opening aligning with a matching opening in said lower and an upper layer of said flexible tape; and said upper layer comprises an adhesive layer, said adhesive layer forming an interface between said TAB tape and said stiffener attaching said TAB tape to said stiffener, furthermore comprises a third opening for insertion of said IC die, said third opening aligning with said second opening in said center layer.

12. The method of claim 10, said multiplicity of stiffeners comprising copper, a stiffener of said multiplicity of stiffeners comprising:

a cavity for insertion of said IC die;

a conductive surface plated with a metal being wettable by solder, this metal being selected from the group consisting of silver or gold; and a material having a thermal expansion coefficient being about equal to a thermal coefficient of silicon.

* * * * *